United States Patent
Cheng et al.

(10) Patent No.: US 9,859,389 B1
(45) Date of Patent: Jan. 2, 2018

(54) SIDEWALL PROTECTIVE LAYER FOR CONTACT FORMATION

(71) Applicant: INTERNATIONAL BUSINESS MACHINES CORPORATION, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/193,404

(22) Filed: Jun. 27, 2016

(51) Int. Cl.
| | |
|---|---|
| H01L 29/06 | (2006.01) |
| H01L 29/423 | (2006.01) |
| H01L 29/66 | (2006.01) |
| H01L 21/28 | (2006.01) |
| H01L 29/78 | (2006.01) |
| H01L 29/417 | (2006.01) |
| H01L 21/311 | (2006.01) |

(52) U.S. Cl.
CPC .. *H01L 29/41791* (2013.01); *H01L 21/31116* (2013.01); *H01L 29/6653* (2013.01); *H01L 29/6656* (2013.01); *H01L 29/66545* (2013.01); *H01L 29/66795* (2013.01); *H01L 29/785* (2013.01)

(58) Field of Classification Search
CPC ............. H01L 29/41791; H01L 29/785; H01L 29/66795; H01L 21/31116; H01L 29/6653; H01L 29/66545; H01L 29/6656
See application file for complete search history.

(56) References Cited

U.S. PATENT DOCUMENTS

| | | | |
|---|---|---|---|
| 6,306,759 | B1 | 10/2001 | Yen et al. |
| 6,329,292 | B1 | 12/2001 | Hung et al. |
| 6,803,318 | B1 | 10/2004 | Qiao et al. |
| 6,864,145 | B2 | 3/2005 | Hareland et al. |
| 7,078,750 | B2 | 7/2006 | Hareland et al. |
| 7,642,162 | B2 | 1/2010 | Matsuo |
| 7,902,603 | B2 | 3/2011 | Matsuo |
| 8,487,397 | B2 | 7/2013 | Ho et al. |
| 9,000,555 | B2 | 4/2015 | Liu et al. |

(Continued)

*Primary Examiner* — Allen Parker
*Assistant Examiner* — Ismail Muse
(74) *Attorney, Agent, or Firm* — Cantor Colburn LLP; Vazken Alexanian

(57) ABSTRACT

A method for forming a semiconductor device comprises forming a sacrificial gate stack on a substrate, spacers adjacent to the sacrificial gate stack, and a source/drain region on the substrate. A first insulator layer is formed on the source/drain region. A portion of the first insulator layer is removed to expose portions of the spacers. Exposed sidewall portions of the spacers are removed to reduce a thickness of the exposed portions of the spacers. A protective layer is deposited over the exposed sidewalls of the spacers and a second insulator layer is deposited over the protective layer. The sacrificial gate is removed to expose a channel region of the substrate. A gate stack is formed over the channel region of the substrate. Exposed portions of the first insulator layer and the second insulator layer are removed to expose the source/drain region, and a conductive is formed on the source/drain region.

14 Claims, 20 Drawing Sheets

(56) References Cited

U.S. PATENT DOCUMENTS

| | | |
|---|---|---|
| 2008/0061370 A1 | 3/2008 | Matsuo |
| 2009/0309161 A1 | 12/2009 | Chang |
| 2010/0072550 A1 | 3/2010 | Matsuo |
| 2013/0171794 A1* | 7/2013 | Pei .................. H01L 29/6656 438/300 |
| 2014/0162447 A1* | 6/2014 | Edge ............... H01L 29/66795 438/586 |
| 2015/0041905 A1* | 2/2015 | Xie .................. H01L 29/6656 257/369 |
| 2015/0221737 A1* | 8/2015 | Liao ................ H01L 21/28114 257/288 |
| 2015/0325690 A1* | 11/2015 | Liu ................. H01L 21/3105 257/288 |
| 2015/0380406 A1* | 12/2015 | Chang .............. H01L 27/0922 257/369 |

\* cited by examiner

SIDEWALL PROTECTIVE LAYER FOR CONTACT FORMATION

BACKGROUND

The present invention generally relates to complimentary metal-oxide semiconductors (CMOS) and metal-oxide-semiconductor field-effect transistors (MOSFET), and more specifically, to forming conductive contacts for MOSFET devices.

The MOSFET is a transistor used for switching electronic signals. The MOSFET has a source, a drain, and gate electrode. The gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and includes n-doped source and drain junctions. The pFET uses holes as the current carriers and includes p-doped source and drain junctions.

The FinFET is a type of MOSFET. The FinFET is a multiple-gate MOSFET device that mitigates the effects of short channels and reduces drain-induced barrier lowering. The "fin" refers to a semiconductor material patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length may be achieved in a given region of the substrate as opposed to a planar FET device.

As CMOS scales to smaller dimensions, nanowire devices provide advantages. A nanowire is often suspended above the substrate by source/drain regions or the gate stack. Because the nanowire is suspended, the channel region of a nanowire device has 360 degrees of exposed area. The gate stack may be formed around the channel region of the nanowire to form a gate-all-around-device. The nanowire may provide even more surface area and greater channel length than a finFET device or planar FET device in a given region of a substrate. Nanowire FETs may be formed from stacked nanowires providing even greater layout density. Stacked nanowires provide, for example, increased drive current within a given layout area.

Gate spacers form an insulating film along gate sidewalls. Gate spacers may also initially be formed along sacrificial gate sidewalls in replacement gate technology. The gate spacers are used to define source/drain regions in active areas of a semiconductor substrate located adjacent to the gate.

Device scaling in the semiconductor industry reduces costs, decreases power consumption, and provides faster devices with increased functions per unit area. Improvements in optical lithography have played a major role in device scaling. However, optical lithography has limitations for minimum dimensions and pitch, which are determined by the wavelength of the irradiation.

SUMMARY

According to an embodiment of the present invention, a method for forming a semiconductor device comprises forming a sacrificial gate stack on a substrate, spacers adjacent to the sacrificial gate stack, and a source/drain region on the substrate. A first insulator layer is formed on the source/drain region. A portion of the first insulator layer is removed to expose portions of the spacers. Exposed sidewall portions of the spacers are removed to reduce a thickness of the exposed portions of the spacers. A protective layer is deposited over the exposed sidewalls of the spacers and a second insulator layer is deposited over the protective layer. The sacrificial gate is removed to expose a channel region of the substrate. A gate stack is formed over the channel region of the substrate. Exposed portions of the first insulator layer and the second insulator layer are removed to expose the source/drain region, and a conductive is formed on the source/drain region.

According to another embodiment of the present invention, method for forming a semiconductor device comprises forming a semiconductor fin on a substrate, a sacrificial gate stack on a channel region of the semiconductor fin, spacers adjacent to the sacrificial gate stack, and a source/drain region on the semiconductor fin adjacent to the spacers. A first insulator layer is formed on the source/drain region adjacent to the spacers. A portion of the first insulator layer is removed to expose portions of the spacers. Exposed sidewall portions of the spacers are removed to reduce a thickness of the exposed portions of the spacers. A protective layer is deposited over the exposed sidewalls of the spacers. A second insulator layer is deposited over the protective layer. The sacrificial gate is removed to expose the channel region of the semiconductor fin. A gate stack is formed over the channel region of the semiconductor. Exposed portions of the first insulator layer and the second insulator layer are removed to expose the source/drain region. A conductive contact is formed on the source/drain region.

According to yet another embodiment of the present invention, a semiconductor device comprises a semiconductor channel region, a gate stack arranged on the semiconductor channel region, and a spacer arranged adjacent to the gate stack, the spacer having a first width in a first region and a second width in a second region. A protective layer is arranged adjacent to the second region of the spacer. A conductive contact is arranged adjacent to the spacer on a source/drain region.

DETAILED DESCRIPTION

Following the formation of gate stacks in MOSFET devices, often an insulator layer is removed to expose the source/drain regions. Following the removal of the insulator layer, a conductive material is deposited over the source/drain regions to form source/drain contacts.

In previous methods for fabricating MOSFET devices, a gate cap such as a nitride material is deposited over the gate stacks to protect the gate stacks during the contact formation process. Often, a resist mask and optical planarization layer is patterned over the gate stacks prior to the removal of the insulator material using a directional etching process. However, directional etching may still undesirably remove exposed portions of the gate spacers or the gate cap, which may expose the gate conductor material prior to the formation of the source/drain contacts. Such an arrangement may result in an electrical short between the source/drain contacts and the gate stack.

The methods and resultant structures described herein provide for forming a layer of material adjacent to the gate spacers that is substantially resistant to lateral etching during the removal of insulator material to form source/drain contacts. Such an arrangement substantially reduces the likelihood of forming an undesirable short between the source/drain contacts and the gate stack.

Figure 1:
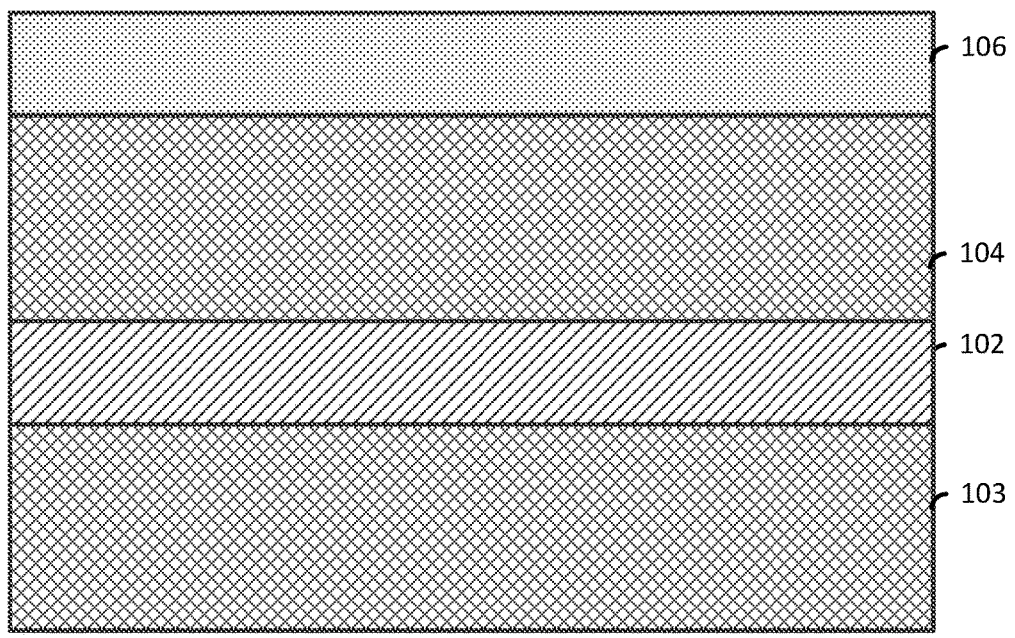
FIG. 1 illustrates a side view of a semiconductor-on-insulator (SOI) wafer.

FIG. 1 illustrates a side view of a semiconductor-on-insulator (SOI) wafer 101. The SOI wafer 101 includes a substrate 103, an insulator layer 102 arranged on the substrate 103, a semiconductor layer 104 arranged on the insulator layer 102, and a hardmask 106 arranged on the semiconductor layer 104.

The SOI wafer 101 can be formed by any suitable technique such as, for example wafer bonding, Smartcut™, SIMOX (Separation by IMplanted Oxygen).

The semiconductor layer 104 may include, for example, silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor layer may also comprise an organic semiconductor or a layered semiconductor such as, for example, Si/SiGe, a silicon-on-insulator or a SiGe-on-insulator. A portion or entire semiconductor layer may be amorphous, polycrystalline, or monocrystalline. In addition to the aforementioned types of semiconductor layers, the semiconductor layer employed in the present invention may also comprise a hybrid oriented (HOT) semiconductor layer in which the HOT substrate has surface regions of different crystallographic orientation. The semiconductor layer may be doped, undoped or contain doped regions and undoped regions therein. The semiconductor layer may contain regions with strain and regions without strain therein, or contain regions of tensile strain and compressive strain.

The insulator layer 102 may include, for example, a buried oxide (BOX) material or other suitable insulator materials. Examples of suitable insulator materials include silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum.

The thickness of insulator layer 102 generally varies and is not intended to be limited. In one aspect, the thickness of the insulator layer 102 is in a range from about 10 nm to about 1000 nm. The insulator layer 102 can be formed by any suitable process such as thermal oxidation, thermal nitridation, chemical vapor deposition (CVD).

A hardmask layer 106 is arranged on the semiconductor layer 104. The hardmask 106 may include, for example, silicon oxide, silicon nitride (SiN), SiOCN, SiBCN or any suitable combination of those. The hardmask 106 may be deposited using a deposition process, including, but not limited to, PVD, CVD, PECVD, or any combination thereof.

Thought the illustrated exemplary embodiments include a SOI wafer 101, alternate exemplary embodiments may include, for example a bulk semiconductor substrate.

Figure 2A:
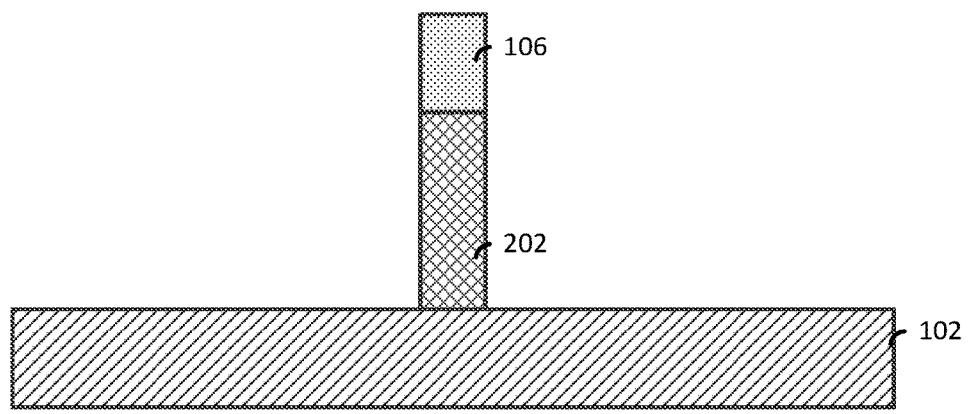
FIG. 2A illustrates a cut-away view along the line A-A (of FIG. 2B) following the formation of a fin on the insulator layer.
Figure 2B:
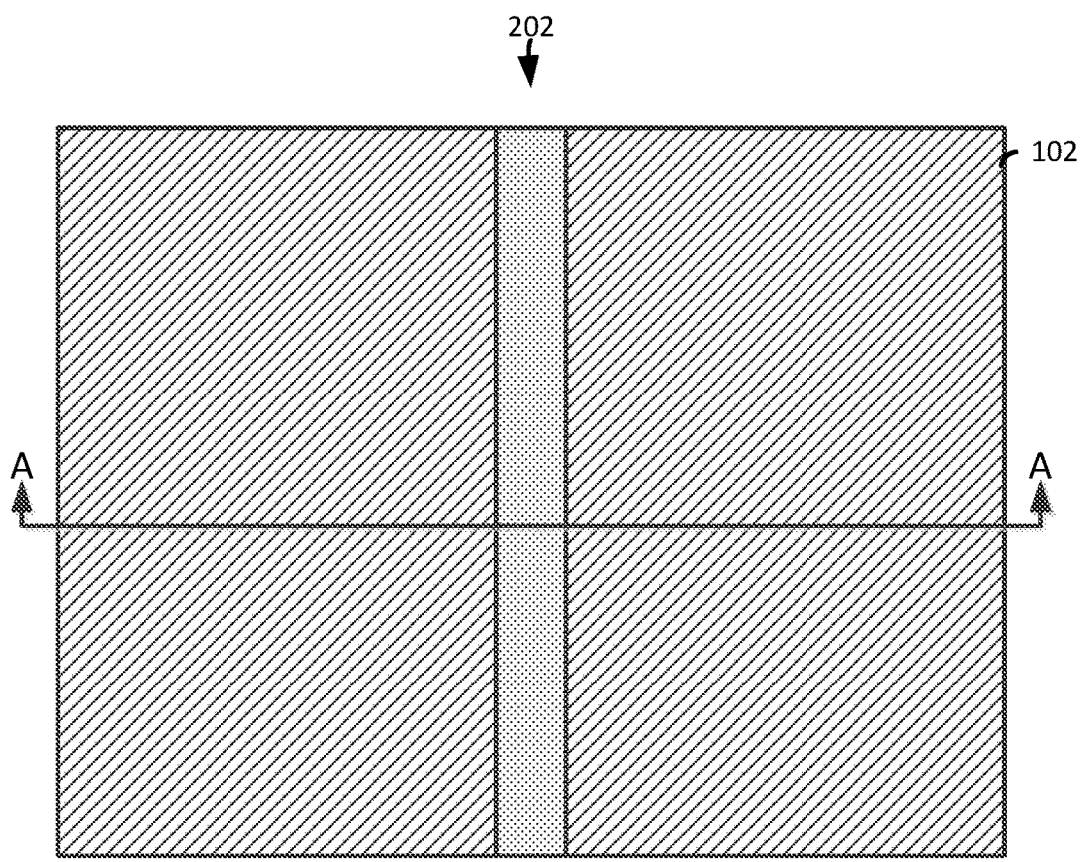
FIG. 2B illustrates a top view of the fin arranged on the insulator layer.

FIG. 2A illustrates a cut-away view along the line A-A (of FIG. 2B) following the formation of a fin 202 on the insulator layer 102. The fin 202 may be patterned by, for example, a lithographic patterning and etching process such as, reactive ion etching (RIE) or a sidewall imaging transfer process that removes exposed portions of the hardmask 106 and portions of the semiconductor layer 104 to expose portions of the insulator layer 102. FIG. 2B illustrates a top view of the fin 202 arranged on the insulator layer 102.

Figure 3:
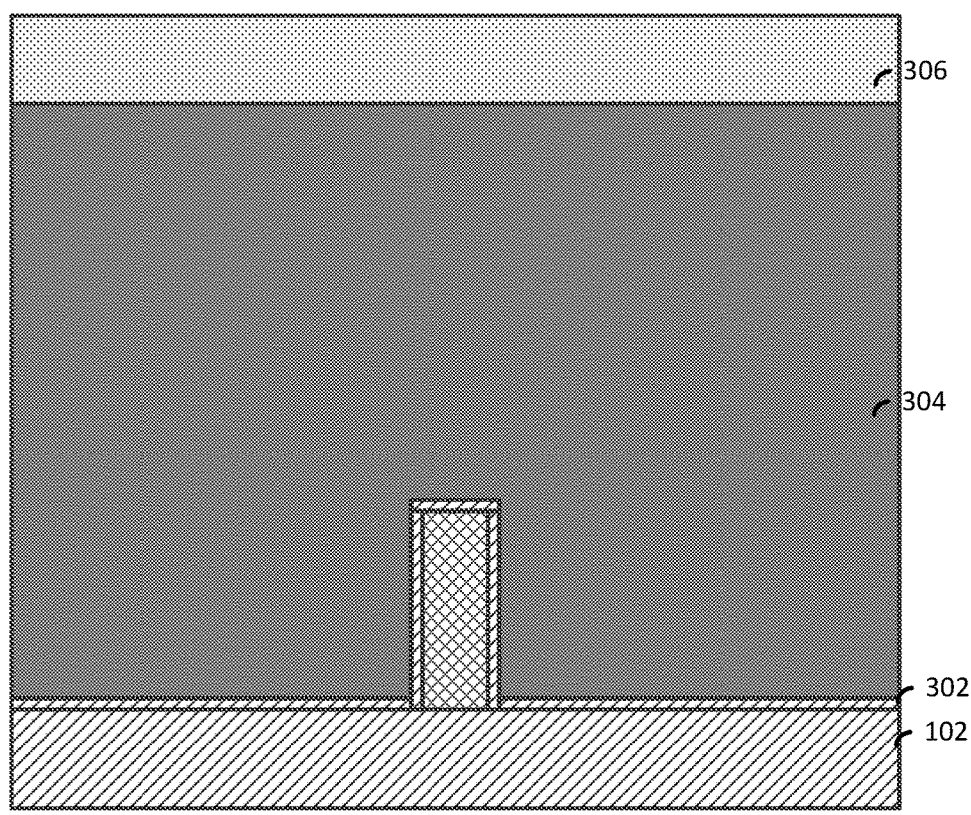
FIG. 3 illustrates a cut-away view following the formation of an oxide layer over exposed portions of the fin and the insulator layer following the removal of the hardmask.

FIG. 3 illustrates a cut-away view following the formation of an oxide layer 302 over exposed portions of the fin 202 and the insulator layer 102 following the removal of the hardmask 106. A layer of sacrificial gate material 304 such as, for example, amorphous silicon (aSi), or polycrystalline silicon (polysilicon) material or another suitable sacrificial gate material is deposited over the oxide layer 302.

The layer sacrificial gate material 304 may be deposited by a deposition process, including, but not limited to, physical vapor deposition (PVD), chemical vapor deposition (CVD), atomic layer deposition (ALD, plasma enhanced chemical vapor deposition (PECVD), inductively coupled plasma chemical vapor deposition (ICP CVD), or any combination thereof.

Following the deposition of the layer of sacrificial gate material, a hardmask 306 such as, for example, silicon oxide, silicon nitride (SiN), SiOCN, SiBCN or any suitable combination of those materials, is deposited on the layer of sacrificial gate material 304 to form a PC hard mask or sacrificial gate cap 306. The hardmask 306 may be deposited using a deposition process, including, but not limited to, PVD, CVD, PECVD, or any combination thereof.

Figure 4A:
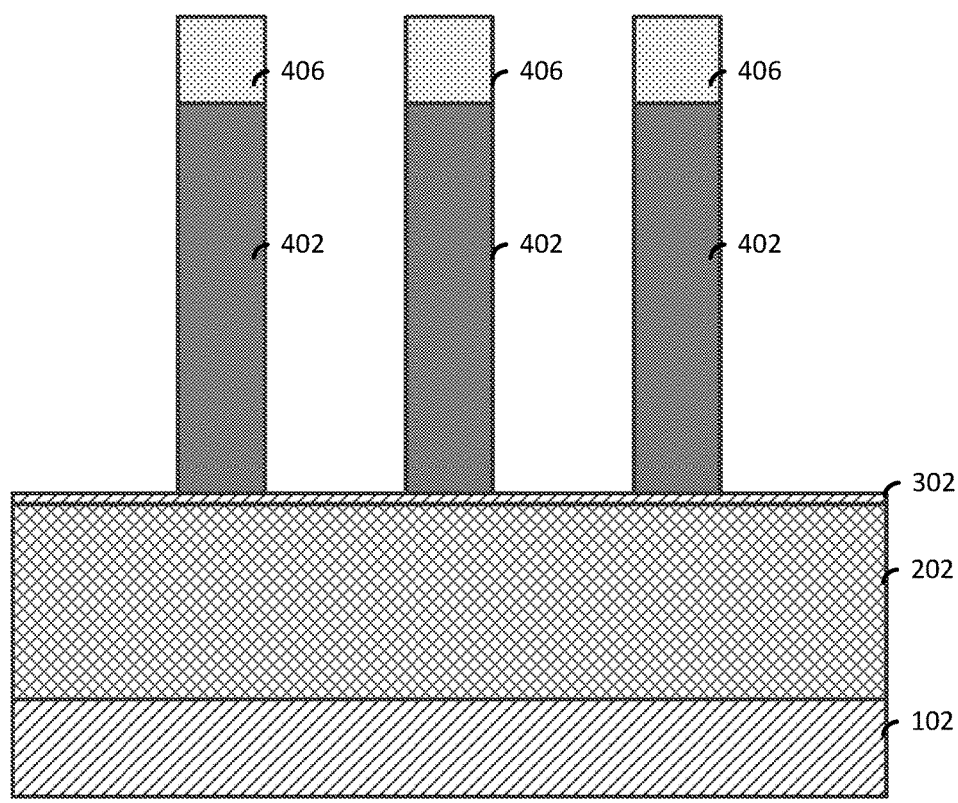
FIG. 4A illustrates a cut-away view along the line A-A (of FIG. 4B) following the formation of sacrificial gates.
Figure 4B:
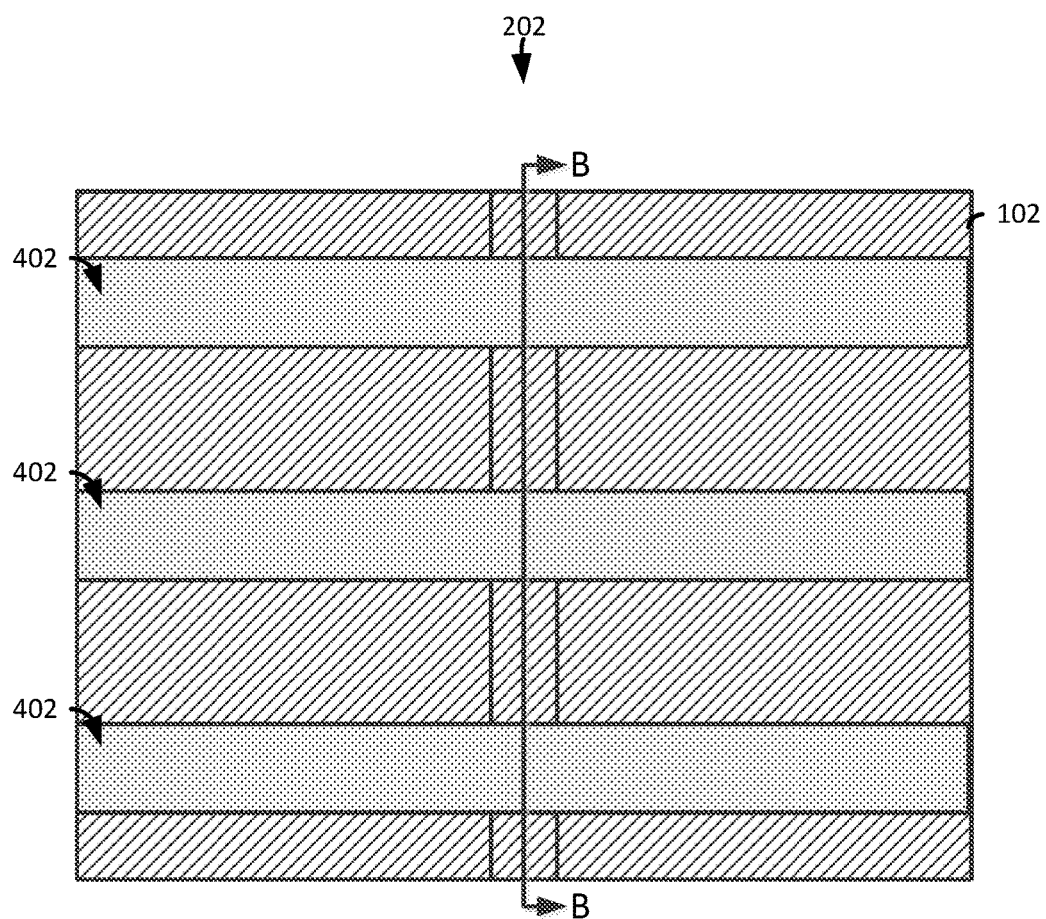
FIG. 4B illustrates a top view of the sacrificial gates.

FIG. 4A illustrates a cut-away view along the line A-A (of FIG. 4B) following the formation of sacrificial gates 304. Following the deposition of the layer sacrificial gate material and the hardmask layer, a lithographic patterning and etching process such as, for example, reactive ion etching or a wet etching process is performed to remove exposed portions of the hardmask layer and the layer of sacrificial gate material form the sacrificial gates 304 and the sacrificial gate caps 306. FIG. 4B illustrates a top view of the sacrificial gates 304.

Figure 5A:
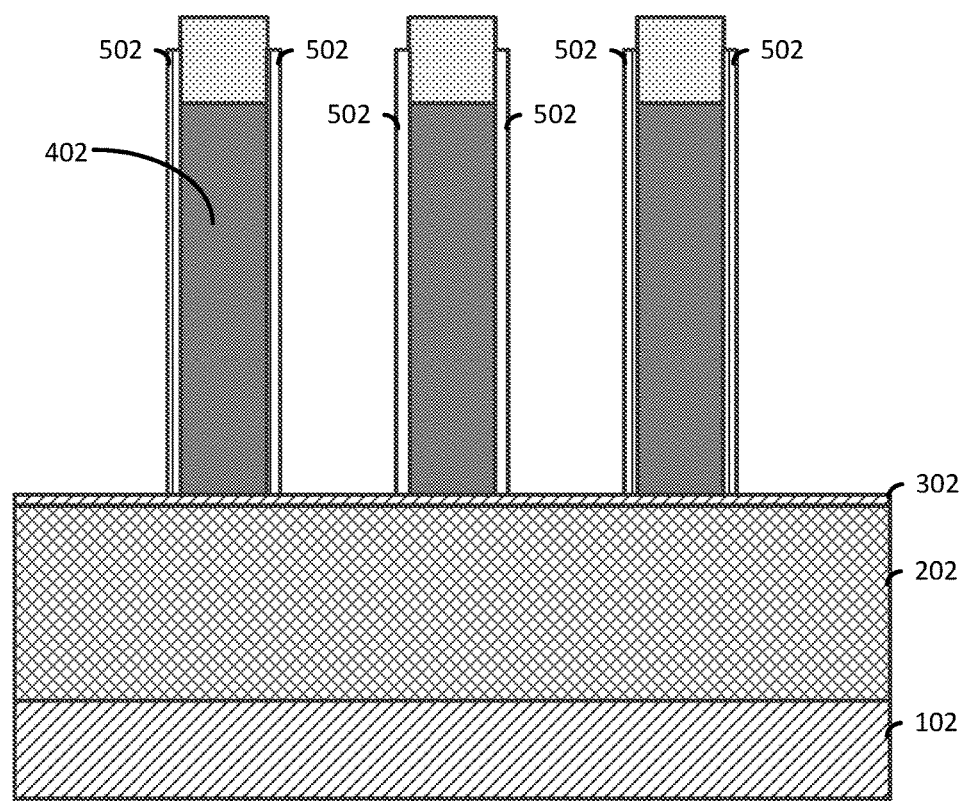
FIG. 5A illustrates a cut-away view following the formation of spacers adjacent to the sacrificial gates.

FIG. 5A illustrates a cut-away view following the formation of spacers 502 adjacent to the sacrificial gates 304. The spacers 502 in the illustrated embodiment are formed by depositing a layer of spacer material (not shown) over the exposed portions of the fin 202 and the sacrificial gates 304. Non-limiting examples of suitable materials for the layer of spacer material include dielectric oxides (e.g., silicon oxide), dielectric nitrides (e.g., silicon nitride), dielectric oxynitrides, or any combination thereof. The layer of spacer material is deposited by a suitable deposition process, for example, chemical vapor deposition (CVD) or physical vapor deposition (PVD).

Following the deposition of the layer of spacer material, a suitable anisotropic etching process such as, for example, a reactive ion etching process is performed to remove portions of the layer of spacer material and form the spacers 502.

Figure 6:
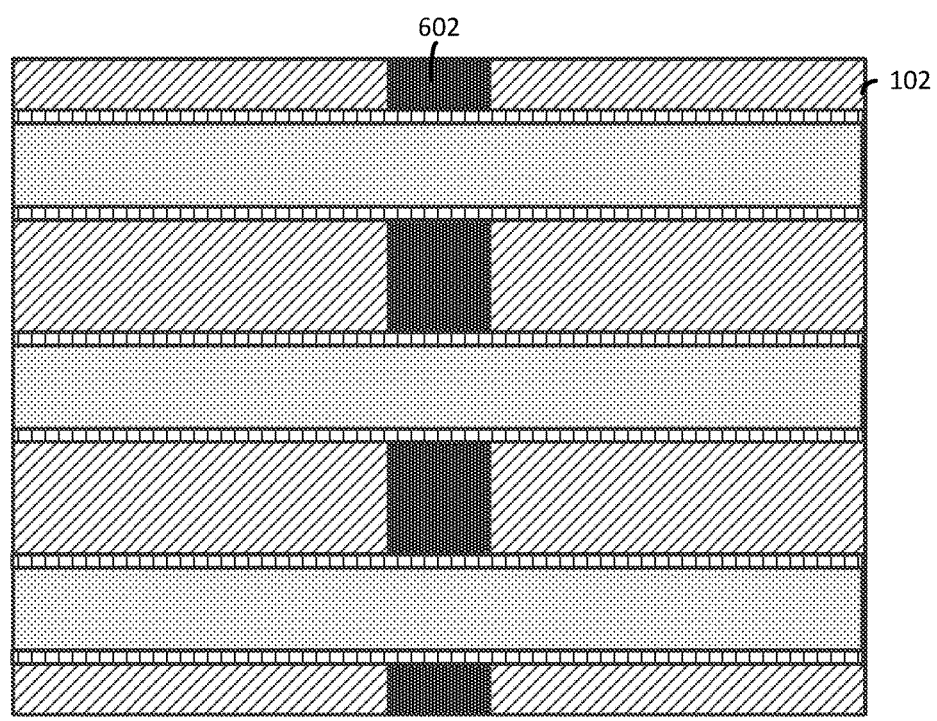
FIG. 6 illustrates a top view following the formation of source/drain regions.

FIG. 6 illustrates a top view following the formation of source/drain regions 602. The source/drain regions 602 are formed by an epitaxial growth process that deposits a crystalline overlayer of semiconductor material onto the exposed crystalline seed material of the exposed fin 202 to form the source/drain regions 602.

Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $2\times10^{21}$ cm$^{-3}$, or preferably between $2\times10^{20}$ cm$^{-3}$ to $1\times10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon may be used.

Figure 7:
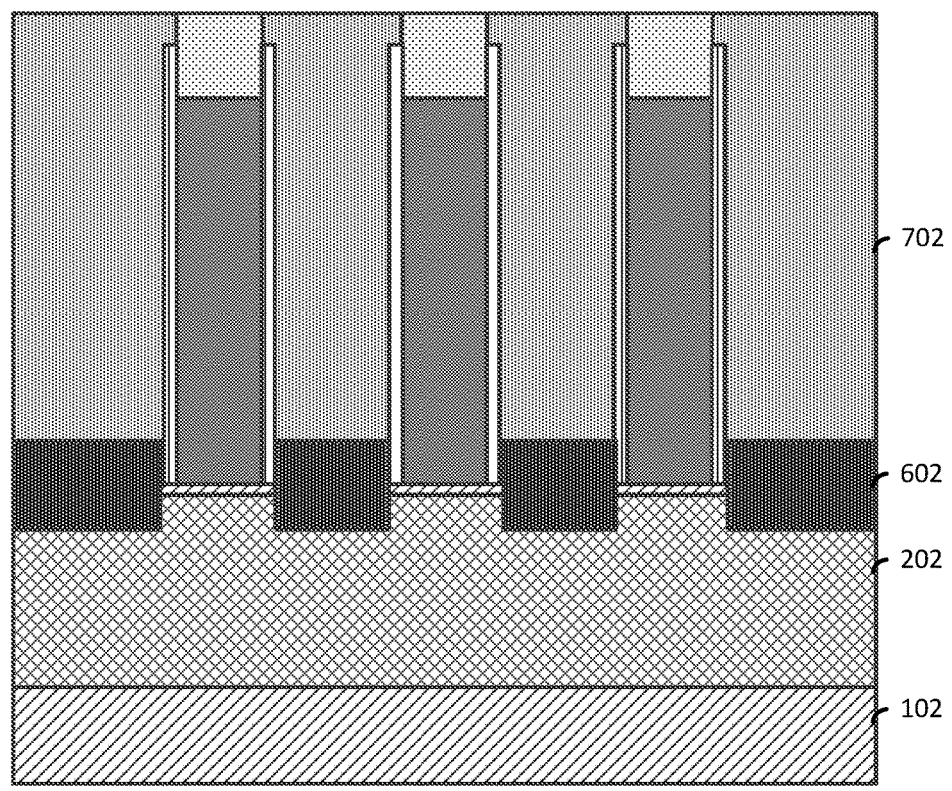
FIG. 7 illustrates a cut-away view along the fin following the formation of an inter-level dielectric layer over the exposed portions of the source/drain regions.

FIG. 7 illustrates a cut-away view along the fin 202 following the formation of an inter-level dielectric layer 702 over the exposed portions of the source/drain regions 602. The inter-level dielectric layer 702 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 702 is deposited by a deposition process, including, but not limited to CVD, PVD, plasma enhanced CVD, atomic layer deposition (ALD), evaporation, chemical solution deposition, or like processes. Following the deposition of the inter-level dielectric layer 702, a planarization process such as, for example, chemical mechanical polishing is performed.

Figure 8:
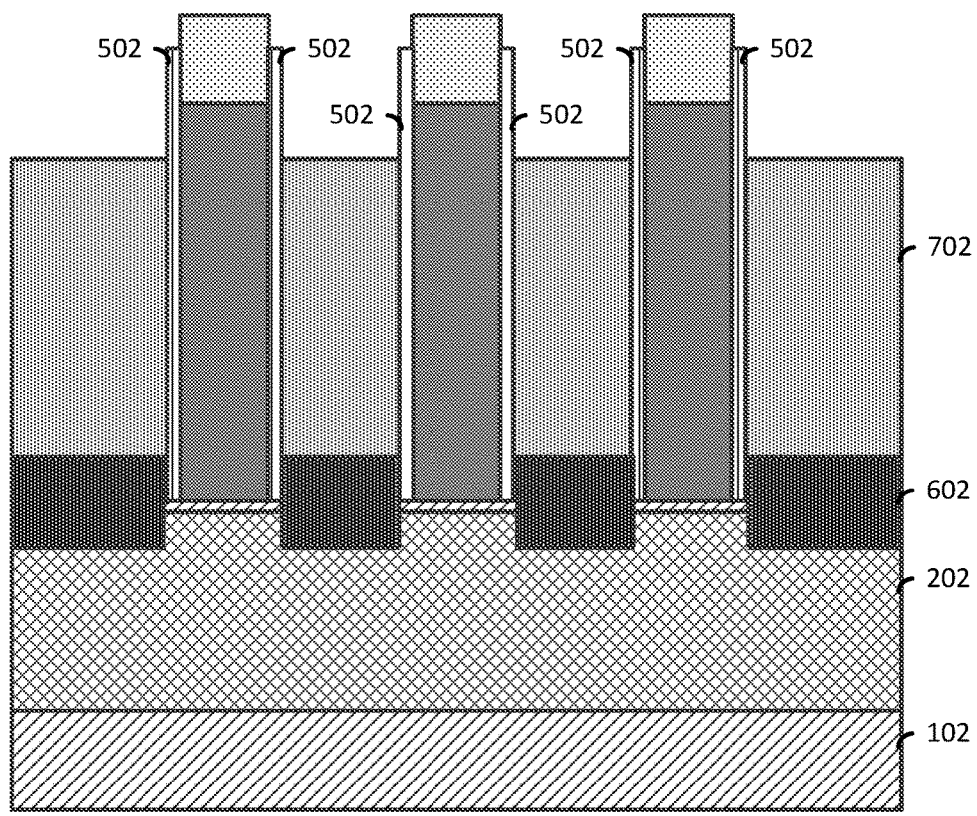
FIG. 8 illustrates a cut-away view following a selective etching process that removes exposed portions of the inter-level dielectric layer to expose sidewalls of the spacers.

FIG. 8 illustrates a cut-away view following a selective etching process that removes exposed portions of the inter-level dielectric layer 702 to expose sidewalls of the spacers 502. The etching process may include, for example, a wet etching or dry etching process or a reactive ion etching process.

Figure 9:
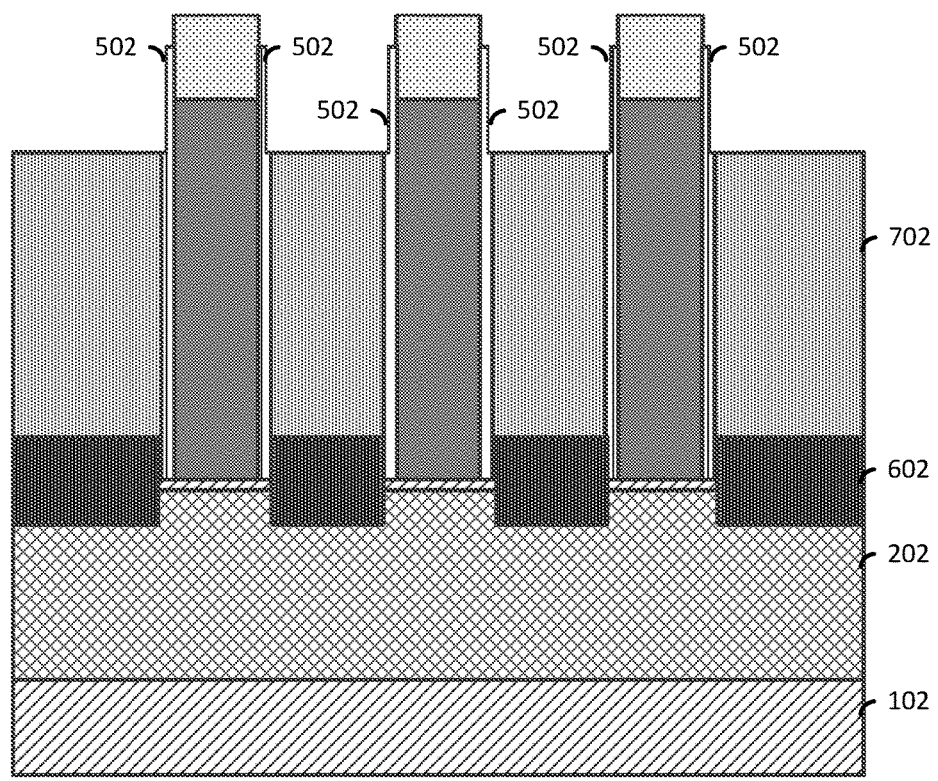
FIG. 9 illustrates a cut-away view following a selective etching process that removes portions of the spacers such that the exposed portions of the spacers have a reduced width.

FIG. 9 illustrates a cut-away view following a selective etching process that removes portions of the spacers 502 such that the exposed portions of the spacers 502 have a reduced width. The etching process may include, for example, a wet etching or dry etching process or a reactive ion etching process.

Figure 10:
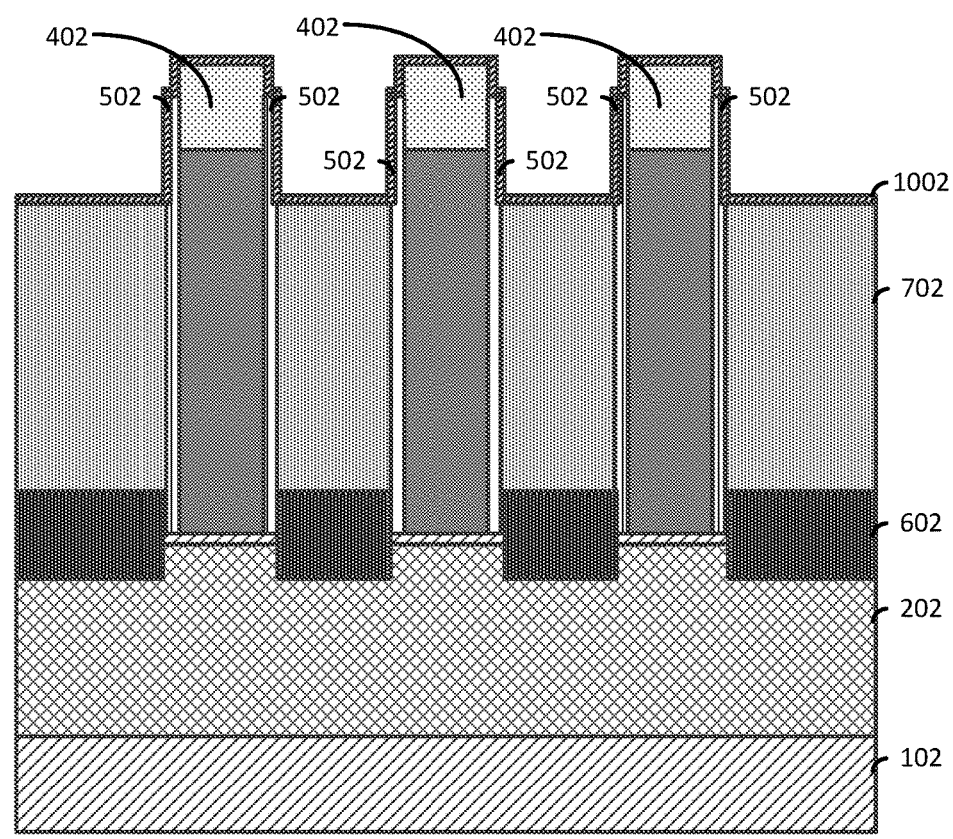
FIG. 10 illustrates a cut-away view following the deposition of a protective layer over exposed portions of the inter-level dialectic layer, the spacers, and the sacrificial gate caps.

FIG. 10 illustrates a cut-away view following the deposition of a protective layer 1002 over exposed portions of the inter-level dialectic layer 702, the spacers 502, and the sacrificial gate caps 402. In the illustrated exemplary embodiment, the protective layer 1002 includes $HfO_2$ however; other materials such as SiOC may be used that are more resistant to etching than the inter-level dielectric layer 702 materials.

Figure 11:
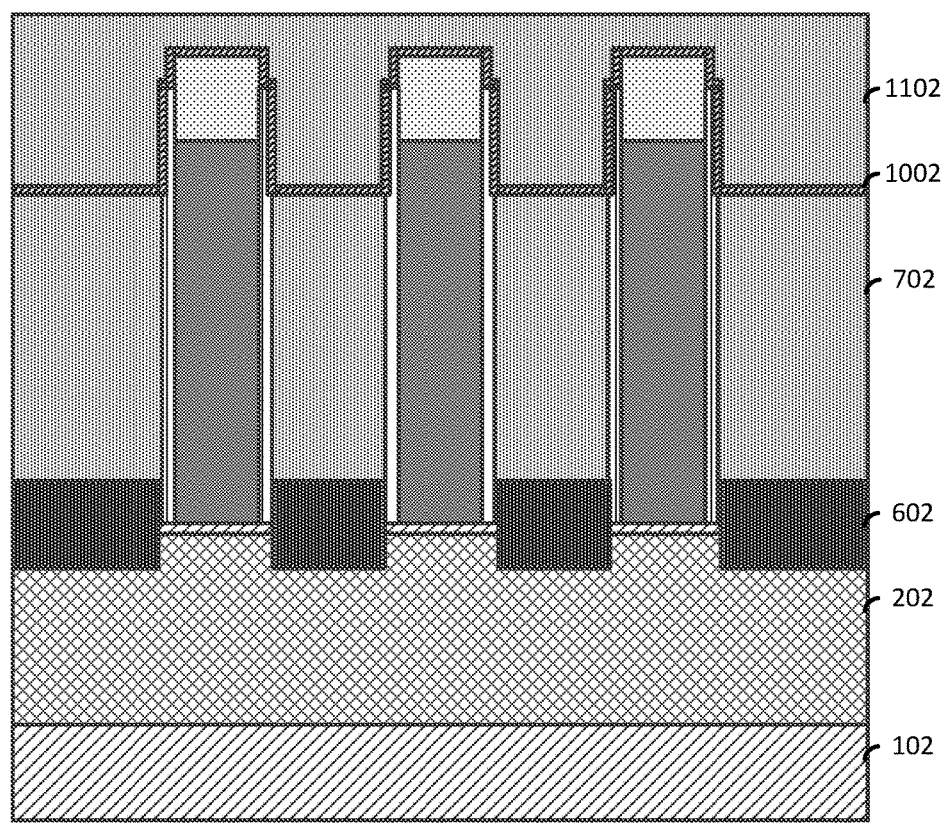
FIG. 11 illustrates a cut-away view following the deposition of another inter-level dielectric layer over the protective layer.

FIG. 11 illustrates a cut-away view following the deposition of another inter-level dielectric layer 1102 over the protective layer 1002. The inter-level dielectric layer 1102 is similar to the inter-level dielectric layer 702 described above.

Figure 12:
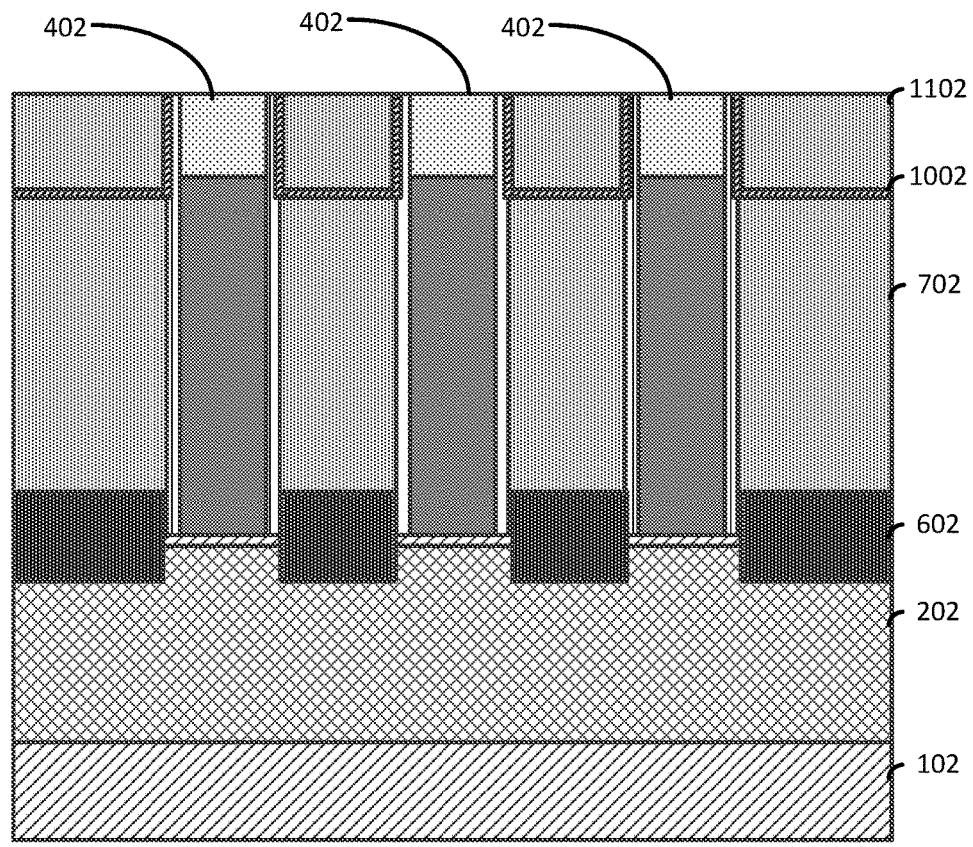
FIG. 12 illustrates a cut-away view following a planarization process such as, for example, chemical mechanical polishing that removes portions inter-level dielectric layer and the protective layer to expose the sacrificial gate caps.

FIG. 12 illustrates a cut-away view following a planarization process such as, for example, chemical mechanical polishing that removes portions inter-level dielectric layer 1102 and the protective layer 1002 to expose the sacrificial gate caps 402.

Figure 13:
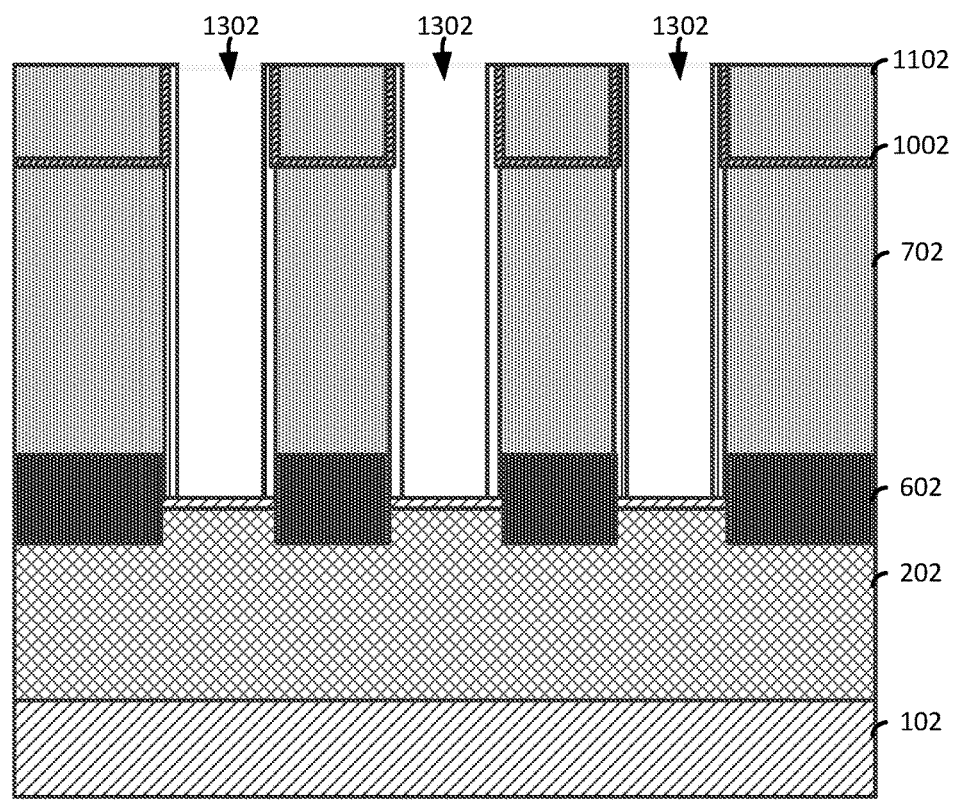
FIG. 13 illustrates a cut-away view of the resultant structure following the removal of the sacrificial gates (of FIG. 12) to form cavities that expose the channel regions of the fin.

FIG. 13 illustrates a cut-away view of the resultant structure following the removal of the sacrificial gates 304 (of FIG. 12) to form cavities 1302 that expose the channel regions of the fin 202. The sacrificial gates 304 may be removed by performing a dry etch process, for example, RIE, followed by a wet etch process. The wet etch process is selective to (will not substantially etch) the spacers 502 and the inter-level dielectric material. The chemical etch process may include, but is not limited to, hot ammonia or tetramethylammonium hydroxide (TMAH).

Figure 14:
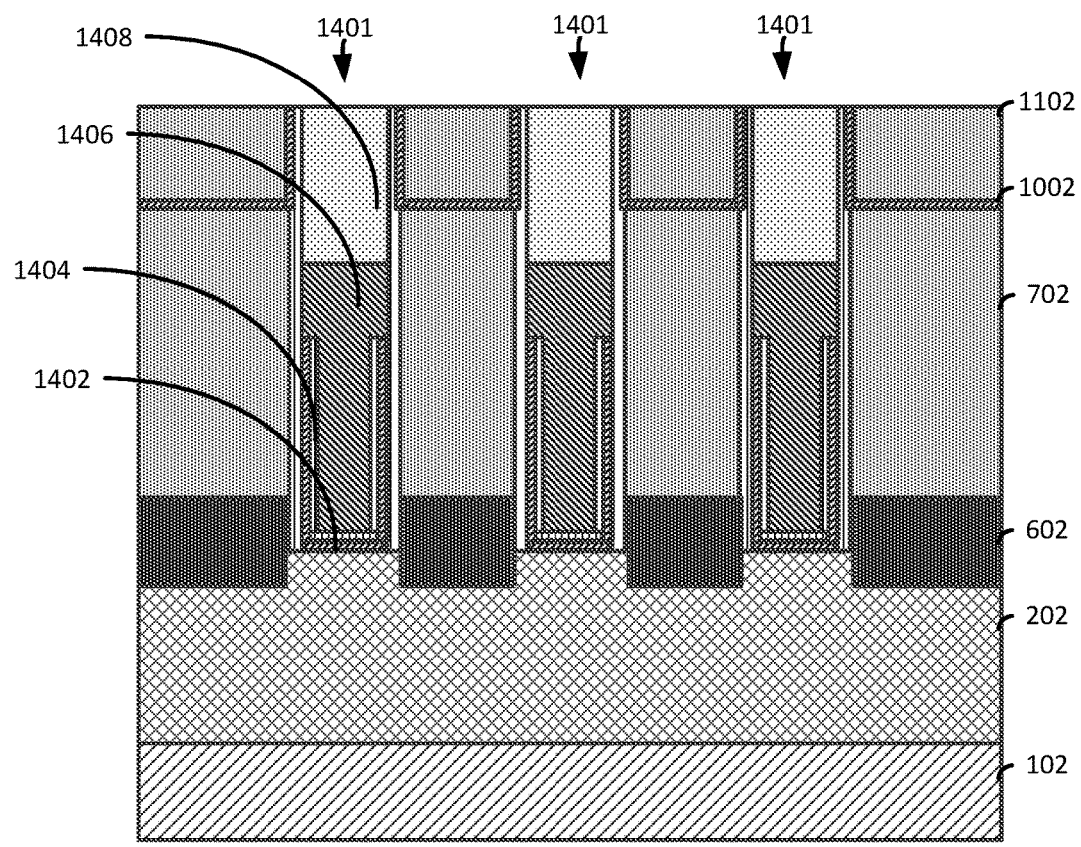
FIG. 14 illustrates a cut-away view of the resultant structure following the formation of a replacement metal gate stack (gate stack).

FIG. 14 illustrates a cut-away view of the resultant structure following the formation of a replacement metal gate stack (gate stack) 1401. The gate stack 1401 include high-k metal gates formed, for example, by filling the cavity 1302 (of FIG. 13) with one or more gate dielectric 1402 materials, one or more workfunction metals 1404, and one or more metal gate conductor 1406 materials. The gate dielectric 1402 material(s) can be a dielectric material having a dielectric constant greater than 3.9, 7.0, or 10.0. Non-limiting examples of suitable materials for the dielectric 1402 materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric 1402 materials may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of high-k dielectric materials used. The dielectric material layer may have a thickness in a range from about 0.5 to about 20 nm.

The work function metal(s) 1404 may be disposed over the gate dielectric 1402 material. The type of work function metal(s) 1404 depends on the type of transistor and may differ between the nFET and pFET devices. Non-limiting examples of suitable work function metals 1404 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

The gate conductor 1406 material(s) is deposited over the gate dielectric 1402 materials and work function metal(s) 1404 to form the gate stack 1401. Non-limiting examples of suitable conductive metals include aluminum (Al), platinum (Pt), gold (Au), tungsten (W), titanium (Ti), or any combination thereof. The gate conductor 1406 material(s) may be deposited by a suitable deposition process, for example, CVD, PECVD, PVD, plating, thermal or e-beam evaporation, and sputtering.

Following the deposition of the gate dielectric 1402 materials, the work function metal(s) 1404, and the gate conductor 1406 material(s), planarization process, for example, chemical mechanical planarization (CMP), is performed to remove the overburden of the deposited gate materials and form the gate stack 1401. A gate cap 1408 is formed over the gate conductor 1406. The gate cap 1408 may include, for example, a nitride material.

Figure 15:
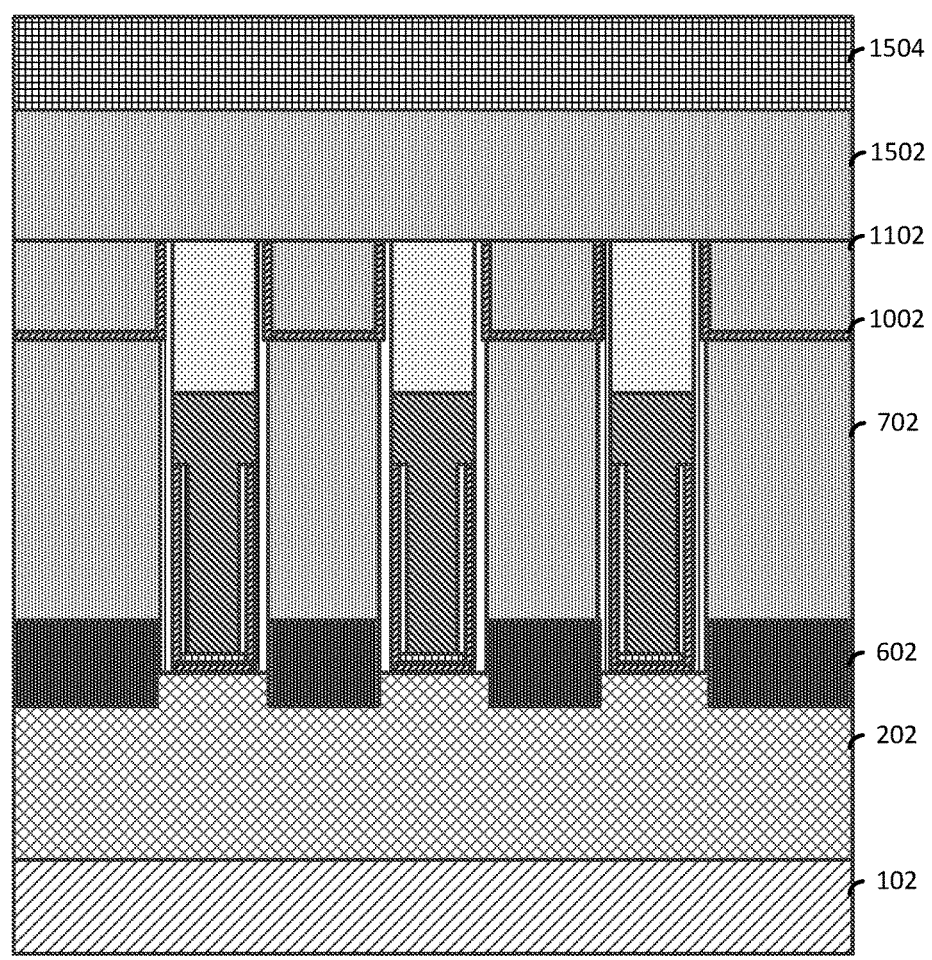
FIG. 15 illustrates a cut-away view following the formation of a sacrificial layer and a sacrificial layer over the replacement metal gate stacks and the inter-level dielectric layer.

FIG. 15 illustrates a cut-away view following the formation of a sacrificial layer 1502 and a sacrificial layer 1504 over the replacement metal gate stacks 1401 and the inter-level dielectric layer 1102. In the illustrated exemplary embodiment the sacrificial layer 1502 includes an oxide material, and the sacrificial layer 1504 includes an organic planarization material.

Figure 16:
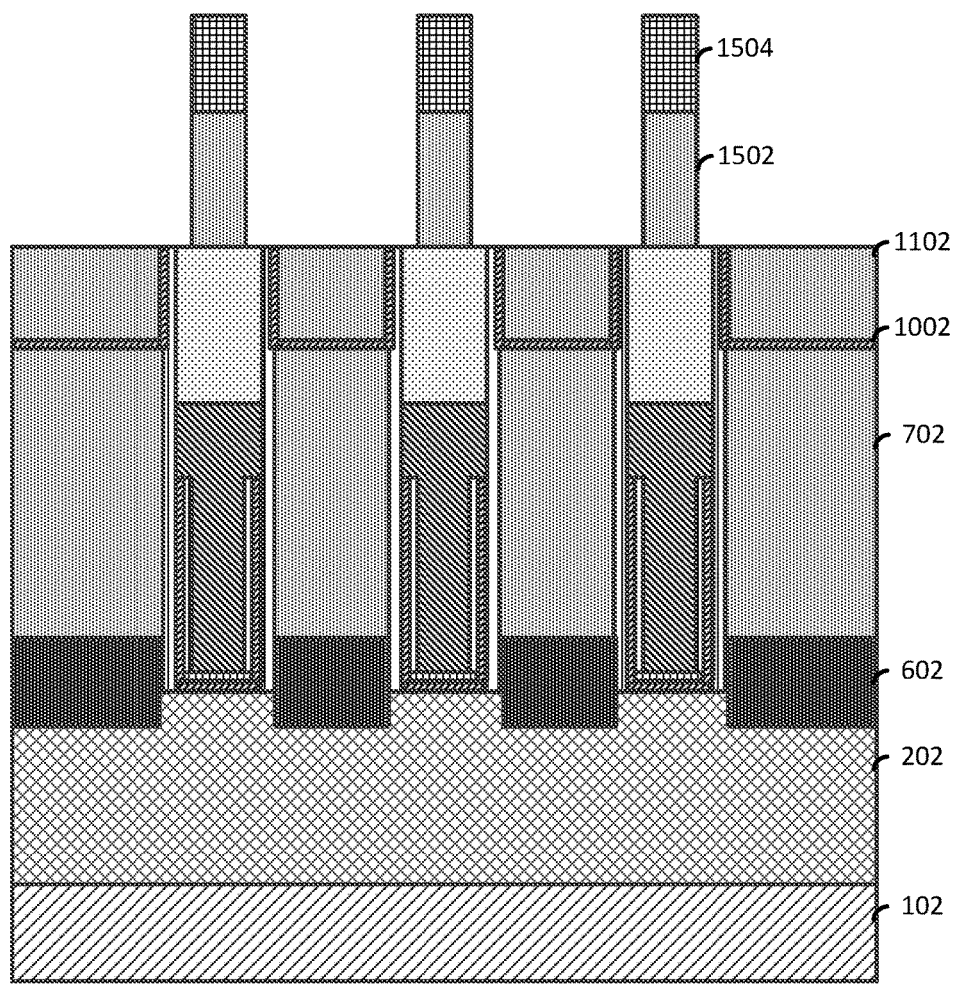
FIG. 16 illustrates a cut-away view following a lithographic patterning and etching process such as, for example, reactive ion etching that removes portions of the sacrificial layers to expose portions of the inter-level dielectric layer.

FIG. 16 illustrates a cut-away view following a lithographic patterning and etching process such as, for example, reactive ion etching that removes portions of the sacrificial layers 1502 and 1504 to expose portions of the inter-level dielectric layer 1102.

Figure 17:
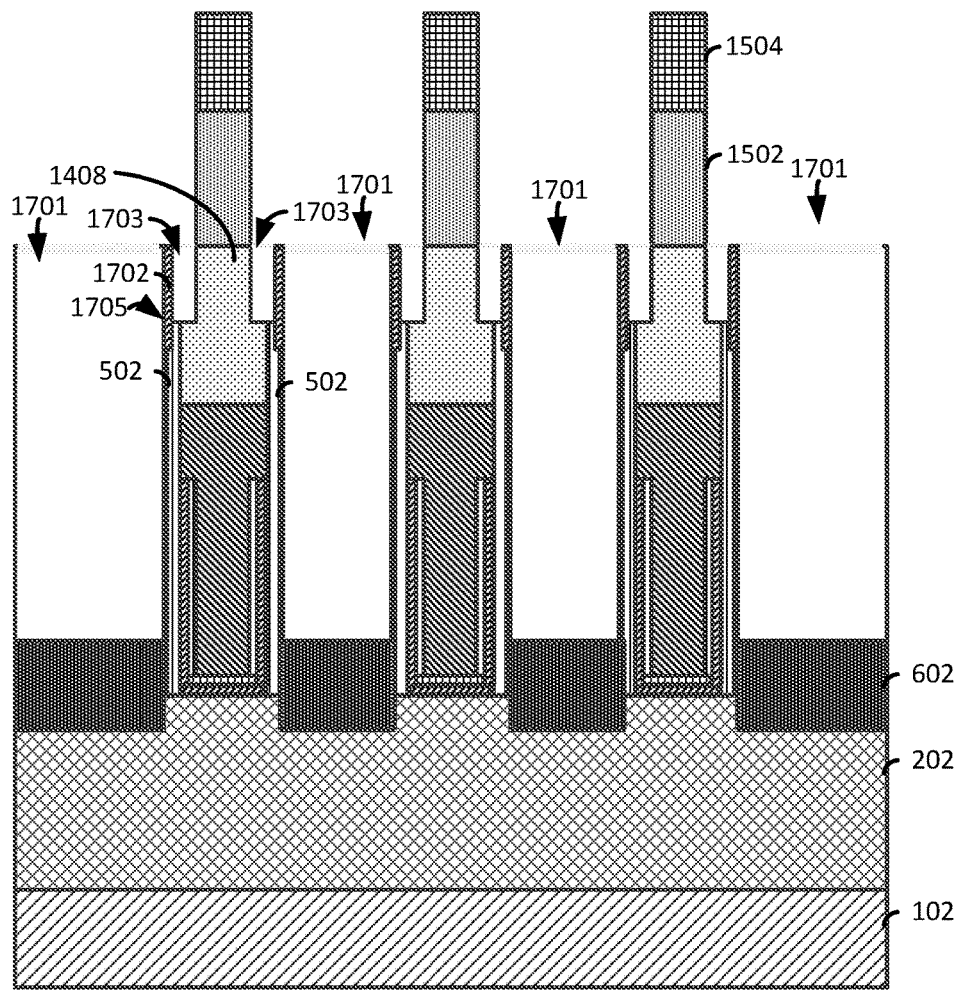
FIG. 17 illustrates a cut-away view following a selective etching process such as, for example, reactive ion etching that removes the exposed portions of the inter-level dielectric layer, the protective layer and the inter-level dielectric layer (of FIG. 16) to form cavities that expose the source/drain regions.

FIG. 17 illustrates a cut-away view following a selective etching process such as, for example, reactive ion etching that removes the exposed portions of the inter-level dielectric layer 1102, the protective layer 1002 and the inter-level dielectric layer 702 (of FIG. 16) to form cavities 1701 that expose the source/drain regions 602.

During the etching process, cavities 1703 are formed when exposed portions of the spacers 502 and the gate caps 1408 are removed. Because the protective layer 1002 etches laterally at a lower rate than the materials of the spacers 502 and the gate caps 1408, portions 1702 of the protective layer 1002 remain to provide a surface 1705 that partially defines the cavity 1702. In other words, the portions 1702 remain above the spacers 502 to substantially preserve the height of the spacers in the cavities 1701.

Figure 18:
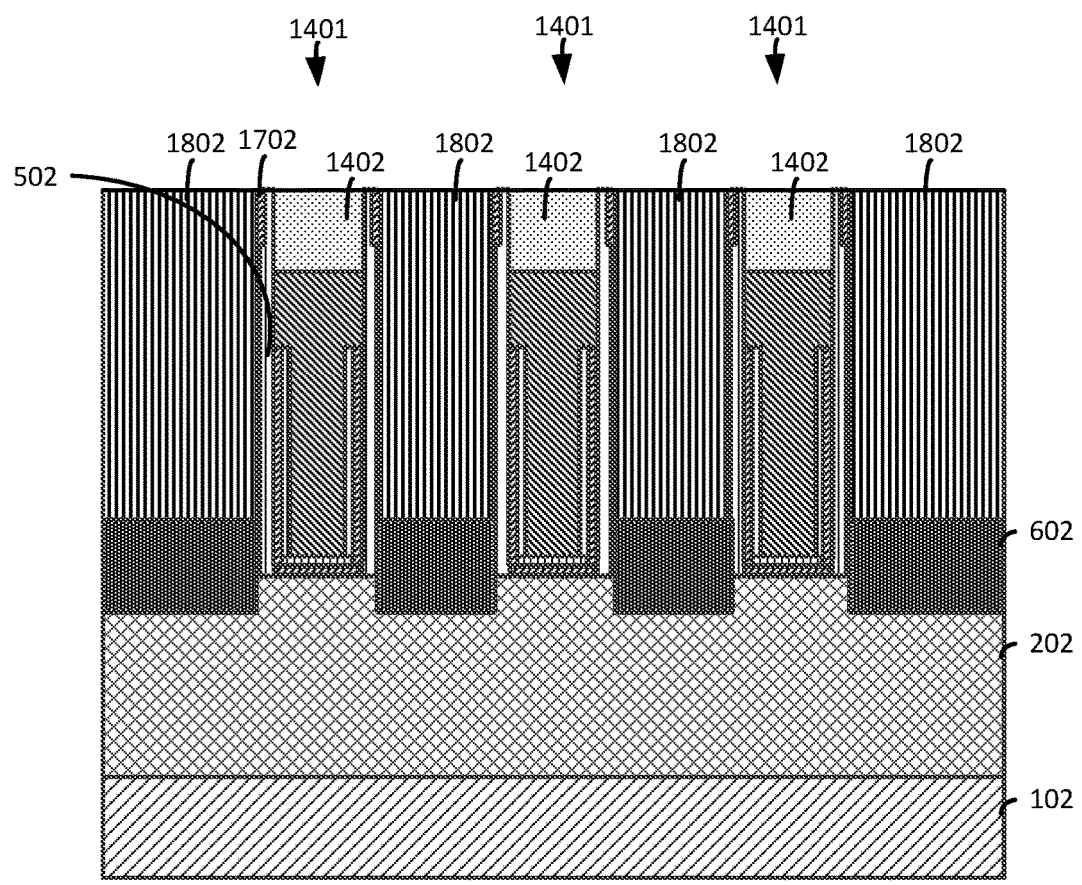
FIG. 18 illustrates a cut-away view of the resultant structure following the removal of the sacrificial layers, and the formation of conductive contacts in the cavities (of FIG. 17).

FIG. 18 illustrates a cut-away view of the resultant structure following the removal of the sacrificial layer 1502 and sacrificial layer 1504, and the formation of conductive contacts 1802 in the cavities 1701 (of FIG. 17). In some embodiments, a liner layer (not shown) may be deposited prior to forming the conductive contacts 1802. The conductive contacts 1802 are formed by, for example, depositing a conductive material in the cavities 1701 and performing a planarization process that removes overburdened conductive material. The planarization process removes portions of the protective layer 1002 and the gate caps 1408, which eliminates the cavities 1703 (of FIG. 17). The resultant structure includes the spacer 502 having a first width in a lower portion and a second, relatively shorter width adjacent to the portion 1702 of the protective layer 1002.

As used herein, the terms "invention" or "present invention" are non-limiting terms and not intended to refer to any single aspect of the particular invention but encompass all possible aspects as described in the specification and the claims. The term "on" may refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a semiconductor device, the method comprising:
   forming a sacrificial gate stack on a substrate;
   forming spacers adjacent to the sacrificial gate stack;
   forming a source/drain region on the substrate adjacent to the spacers;
   forming a first insulator layer on the source/drain region adjacent to the spacers;
   removing a portion of the first insulator layer to expose portions of the spacers;
   removing exposed sidewall portions of the spacers to reduce a thickness of the exposed portions of the spacers;
   depositing a protective layer over the exposed sidewalls of the spacers;
   depositing a second insulator layer over the protective layer;
   removing the sacrificial gate stack to expose a channel region of the substrate;
   forming a gate stack over the channel region of the substrate;
   removing exposed portions of the first insulator layer and the second insulator layer to expose the source/drain region; and
   forming a conductive contact on the source/drain region,
   wherein forming the gate stack includes forming a gate cap over the gate stack, wherein a portion of the protective layer is in contact with sidewalls of the gate cap.

2. The method of claim 1, wherein the spacers include a nitride material.

3. The method of claim 1, wherein the protective layer includes hafnium oxide material.

4. The method of claim 1, wherein the removing the exposed sidewall portions of the spacers to reduce a thickness of the exposed portions of the spacers includes a selective lateral etch process.

5. The method of claim 1, wherein the first insulator layer includes an oxide material and the second insulator layer includes an oxide material.

6. The method of claim 1, wherein the removing exposed portions of the first insulator layer and the second insulator layer to expose the source/drain region includes removing portions of the protective layer.

7. The method of claim 1, wherein removing exposed portions of the first insulator layer and the second insulator layer to expose the source/drain region includes removing portions of the gate cap.

8. A method for forming a semiconductor device, the method comprising:
   forming a semiconductor fin on a substrate;
   forming a sacrificial gate stack on a channel region of the semiconductor fin;
   forming spacers adjacent to the sacrificial gate stack;
   forming a source/drain region on the semiconductor fin adjacent to the spacers;
   forming a first insulator layer on the source/drain region adjacent to the spacers;
   removing a portion of the first insulator layer to expose portions of the spacers;
   removing exposed sidewall portions of the spacers to reduce a thickness of the exposed portions of the spacers;
   depositing a protective layer over the exposed sidewalls of the spacers;
   depositing a second insulator layer over the protective layer;
   removing the sacrificial gate stack to expose the channel region of the semiconductor fin;

forming a gate stack over the channel region of the semiconductor;

removing exposed portions of the first insulator layer and the second insulator layer to expose the source/drain region; and forming a conductive contact on the source/drain region, wherein forming the gate stack includes forming a gate cap over the gate stack, wherein a portion of the protective layer is in contact with sidewalls of the gate cap.

9. The method of claim 8, wherein the spacers include a nitride material.

10. The method of claim 8, wherein the protective layer includes hafnium oxide material.

11. The method of claim 8, wherein the removing the exposed sidewall portions of the spacers to reduce a thickness of the exposed portions of the spacers includes a selective lateral etch process.

12. The method of claim 8, wherein the first insulator layer includes an oxide material and the second insulator layer includes an oxide material.

13. The method of claim 8, wherein the removing exposed portions of the first insulator layer and the second insulator layer to expose the source/drain region includes removing portions of the protective layer.

14. The method of claim 8, wherein removing exposed portions of the first insulator layer and the second insulator layer to expose the source/drain region includes removing portions of the gate cap.

\* \* \* \* \*